United States Patent [19]

Sanders et al.

[11] 4,399,209

[45] Aug. 16, 1983

[54] TRANSFER IMAGING SYSTEM

[75] Inventors: Frederick W. Sanders; Gary F. Hillenbrand; Jonathan S. Arney; Richard F. Wright, all of Chillicothe, Ohio

[73] Assignee: The Mead Corporation, Dayton, Ohio

[21] Appl. No.: 320,356

[22] Filed: Nov. 12, 1981

[51] Int. Cl.$^3$ .......................... G03C 1/40; G03C 1/00
[52] U.S. Cl. .................................... 430/138; 430/211
[58] Field of Search ............... 430/138, 345, 962, 211, 430/235

[56] References Cited

U.S. PATENT DOCUMENTS

| | | | |
|---|---|---|---|
| 2,953,454 | 9/1960 | Berman | 430/345 |
| 3,016,308 | 1/1962 | Macaulay | 430/138 |
| 3,072,481 | 1/1963 | Berman et al. | 430/138 |
| 3,090,687 | 5/1963 | Berman | 430/138 |
| 3,111,407 | 11/1963 | Lindquist et al. | 430/138 |
| 3,116,148 | 12/1963 | Miller | 430/138 |
| 3,202,510 | 8/1965 | Hollmann | 430/138 |
| 3,219,446 | 11/1965 | Berman | 430/138 |
| 3,272,629 | 9/1966 | Hills | 430/138 |
| 3,700,439 | 10/1972 | Phillips | 430/138 |
| 3,736,139 | 5/1973 | Yamashita et al. | 430/353 |
| 3,892,569 | 7/1975 | Speers | 430/541 |
| 4,000,087 | 12/1976 | Maalout | 430/138 |
| 4,110,511 | 8/1978 | Lee et al. | 430/138 |
| 4,149,887 | 4/1979 | Levy . | |

FOREIGN PATENT DOCUMENTS

| | | |
|---|---|---|
| 44-17733 | 8/1969 | Japan . |
| 49-6212 | 2/1974 | Japan . |
| 52-34488 | 9/1977 | Japan . |
| 53-9519 | 1/1978 | Japan . |
| 53-9520 | 1/1978 | Japan . |
| 1001832 | 8/1965 | United Kingdom . |
| 1058798 | 2/1967 | United Kingdom . |
| 1141475 | 1/1969 | United Kingdom . |
| 1193923 | 6/1970 | United Kingdom . |

OTHER PUBLICATIONS

"What's Ahead?", by Lloyd E. Varden, *Modern Photography*, p. 86, 1958.

*Primary Examiner*—John E. Kittle
*Assistant Examiner*—John L. Goodrow
*Attorney, Agent, or Firm*—Biebel, French & Nauman

[57] ABSTRACT

A transfer imaging system is disclosed wherein images are formed by image-wise exposing a layer comprising a chromogenic material and pressure rupturable capsules containing, as an internal phase, a photosensitive composition. In a preferred embodiment, the chromogenic material is encapsulated with the photosensitive composition. Upon exposure and capsule rupture the chromogenic material is image-wise transferrable to a developer or copy sheet where the chromogenic material reacts with a developer to form an image. Preferred systems are sensitive to U.V. or blue light in the wavelength range of 380 to 480 nm.

31 Claims, 3 Drawing Figures

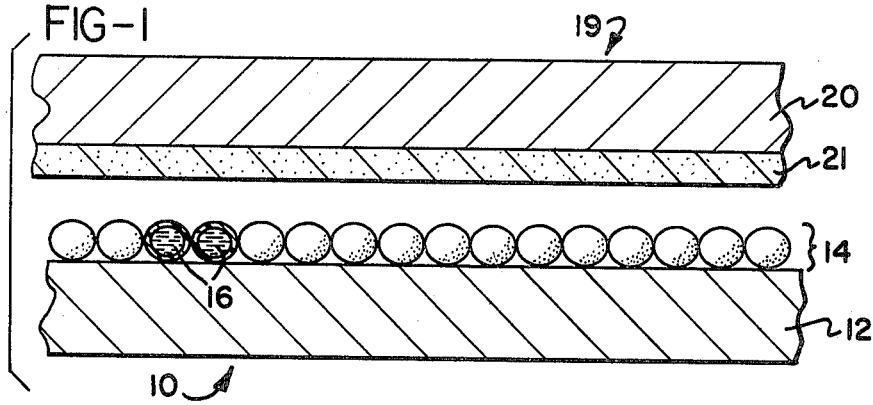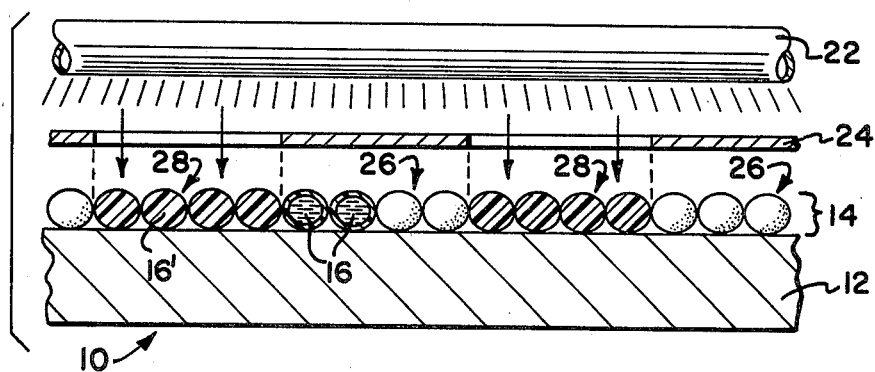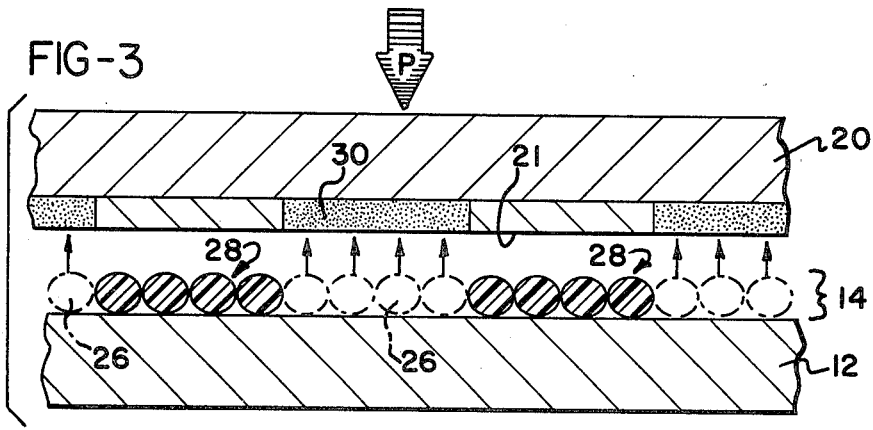

TRANSFER IMAGING SYSTEM

BACKGROUND OF THE INVENTION

The present invention relates to an imaging system and more particularly to an office based system which is suitable for making photocopies. In accordance with the invention, images are formed by image-wise exposing a composition comprising a chromogenic material and photosensitive encapsulate to actinic radiation and rupturing the capsules in the presence of a developer whereby a patterned reaction between the chromogenic material and developer is obtained which produces an image. This application specifically addresses transfer systems in which the capsules are ruptured in contact with a developer sheet to which chromogenic material is transferred for the patterned image-forming reaction.

Imaging systems based on photosensitive encapsulates are known. Berman, U.S. Pat. No. 3,219,446 discloses a transfer imaging process in which azo-blue-"B" black dye is encapsulated with a cross-linkable polymer or a polymerizable monomer as a fluid-droplet containing film or a fluid droplet containing microcapsules. As described, the Berman imaging system is a transfer system which relies upon selectively transferring the encapsulated dye to a copy sheet in correspondence with the image. Imaging is accomplished by image-wise exposing a layer of the encapsulate to electromagnetic radiation to cross-link the polymer, causing the liquid in the exposed capsules to assume a rigid condition and not transfer to a copy sheet. Dye transfer is limited in the unexposed areas of the encapsulate containing layer.

Phillips, U.S. Pat. No. 3,700,439 discloses a photocopy process wherein Michler's ketone is encapsulated in a conventional manner and provided as a layer on a support. Michler's ketone itself is not a color former, but patterned irradition of the ketone containing capsules produces a latent image of colorless, acid-colorable, dye precursor from the ketone such that upon contact with an acid developer such as acid clay a visible image is obtained. Phillips discloses both a system wherein the exposed imaging sheet is calendered face-to-face with an acid-coated receiving sheet to form images and a system wherein the acid developer is on the same surface as the capsule coating so that after rupturing the capsules on the imaging sheet there is development without transfer.

Berman et al, U.S. Pat. No. 3,072,481 discloses another type of encapsulated light sensitive element which utilizes a light-sensitive material which is readily converted to a colored form when carried in a liquid vehicle but which is insensitive to light when solid. By encapsulating such a material with a volatile solvent, image-wise exposing a layer of the encapsulate and rupturing the capsules to evaporate the solvent, an image is obtained and fixed.

Forris, U.S. Pat. No. 3,001,873, discloses a more complex system wherein the walls of capsules containing a solid dye are photosensitized such that patterned exposure renders the capsules unswellable. By wetting the sheet to swell the unexposed capsules and heating, the dye is immobilized in the unexposed areas. Thereafter, by rupturing the capsules in contact with a receiving sheet there is an image-wise transfer of the dye form the exposed areas only.

While image-forming techniques such as these have been know, for various reasons, they have not matured into commercial photocopy systems. Furthermore, the potential of these systems to afford a low cost imaging system has not been realized.

SUMMARY OF THE INVENTION

Thus, a principal object of the present invention is to provide an imaging system in which images are formed by image-wise exposing a photosensitive encapsulate to actinic radiation and rupturing the capsules in the presence of a developer such that there is a patterned reaction of a chromogenic material, present in the encapsulate or co-deposited on a support with the encapsulate, and the developer which yields an image of the original.

Another object of the present invention is to provide an imaging system based on a photosensitive encapsulate which provides images with high resolution and good tonal qualities.

Still another object of the present invention is to provide a dry photocopy system which is affordable and does not require expensive and sophisticated machinery for exposure and processing.

A specific object of the present invention is to provide a transfer imaging system in which an image-wise exposed imaging sheet bearing the photosensitive encapsulate is placed in contact with a developer or copy sheet and the capsules are ruptured such that chromogenic material pattern-wise transfers to the developer sheet and reacts to form an image.

Another object of the present invention is to provide an imaging system which is useful in transmission and reflected light imaging and hence can be utilized in photocopying printed documents and other materials.

Another object of the present invention is to provide an imaging sheet carrying a photosensitive encapsulate wherein the encapsulate comprises a chromogenic material and a photosensitive composition.

Another more particular object of the present invention is to provide an imaging paper which is sensitive to blue light (380 to 480 nm), and which incorporates a fugitive yellow dye such that said system can be handled in room light for sufficiently short periods of time to load said paper in an exposure apparatus.

A still further object of the present invention is to provide an imaging process wherein images are formed by exposing a layer of a photosensitive encapsulate preferably containing a chromogenic material to actinic radiation, and rupturing the capsule in the presence of a developer.

These and other objects are attained in the present invention which in a specific embodiment relates to a transfer imaging system basically having:
  an imaging sheet having a first substrate,
  a chromogenic material,
  a photosensitive composition,
  a coating containing said chromogenic material and said photosensitive composition on one surface of said first substrate,
  said photosensitive composition being encapsulated in pressure rupturable capsules, as an internal phase, and
  a developer sheet comprising a second substrate and a developer material which is capable of reacting with the chromogenic material to form a an image on one surface of said second substrate upon transfer of said chromogenic material thereto.

Herein, the term "encapsulated" refers to both so-called resin dispersion or open phase systems in which the internal phase containing the chromogenic material is dispersed as droplets throughout a dispersing medium and systems in which the capsule is formed with a discrete capsular wall, the latter encapsulation typically being in the form of microcapsules. "Pressure rupturable capsules" are, accordingly, considered to exist in either of these "encapsulated" systems. Furthermore, while the capsules are described herein as "pressure rupturable" means other than pressure may be used to rupture them.

In accordance with the present invention images are formed by exposing a coated composition containing the chromogenic material and the encapsulated photosensitive composition to actinic radiation and rupturing the capsules in the presence of a developer. The invention system is designed such that when these steps are carried out, the image-forming reaction between the chromogenic material and the developer discriminately occurs in the exposed or unexposed areas and produces a detectable image. In the case of a transfer imaging system, this is accomplished by image-wise photochemically controlling whether the chromogenic material can transfer from the imaging sheet to the developer sheet. By "image-wise" it is meant that upon exposure and transfer the chromogenic material and the developer react to form a positive or negative image of the original.

In accordance with the principal embodiment of the invention, the chromogenic material is encapsulated with a photosensitive composition. In general, the photosensitive composition can be described as one having a viscosity which changes upon exposure to actinic radiation such that upon exposure there is a change in the viscosity of the internal phase in the exposed areas which image-wise determines whether the chromogenic material is accessible to the developer. The photosensitive composition may be radiation curable composition which, upon exposure to light, increases in viscosity and immobilizes the chromogenic material, thereby preventing it from transfering to the developer sheet and reacting with the developer material entirely or in proportion to the tonal depth of the image in the exposed areas. [The term "curable" as used herein is not limited to materials which are cross-linked, but is open to materials which are simply polymerized.] In another case the chromogenic material is encapsulated with a substance which is depolymerized or otherwise decreased in molecular weight upon exposure, resulting in a decrease in viscosity which renders the chromogenic material accessible (transferable) to the developer in the exposed areas.

It will be evident that in the former case the system is a positive working system, whereas in the latter case it is a negative-working system. Using a radiation curable material, when the internal phase contains the chromogenic material, it is rendered inaccessible to the developer in the exposed areas, thereby preventing the formation of an image in those areas. More particularly, the chromogenic material is immobilized in the cured matrix of the photosensitive composition such that it cannot transfer to the developer sheet and react to form an image. In the unexposed areas, which in reflection imaging correspond to the printed areas of printed documents, the internal phase remains liquid and the chromogenic material can react with the developer to form a positive image. In a negative-working system, the photosensitive composition in a chromogenic material containing encapulate is viscous and upon exposure it liquefies so that the chromogenic material is transferable to the developer sheet. Thus, in this sytem, exposure renders the chromogenic material accessible to the developer, the chromogenic material being inherently immobilized in the unexposed material.

The chromogenic material is not necessarily encapsulated with the photosensitive composition although this is a preferred means for carrying out the present invention. The chromogenic material may be co-deposited on the supporting substrated with the encapsulated photosensitive composition or contained in the capsular wall such that upon capsule rupture the chromogenic material is dissolved and carried to the developer material in a discriminate manner. Hence, the photosensitive composition may be encapsulated with a solvent for the chromogenic material or the unpolymerized monomer may dissolve the chromogenic material such that as a result of the exposure, the access between the developer and the chromogenic material is controlled as described herein.

It should be apparent that the system does not necessarily require a given capsule to completely release or completely retain its chromogenic encapsulate as long as there is a difference in the amount of chromogenic material transferring or migrating to the developer in the exposed versus the unexposed areas. Indeed, the invention produces images having tonal quality superior to that obtained in most conventional photocopy systems. One reason for the tonal quality of the images obtained in accordance with the invention is that the amount of chromogenic material released from a given area of a microcapsule coated sheet depends on the degree of exposure of the internal phase of the capsules in that area. Furthermore, it is also not clear whether the amount of chromogenic material transferred is determined by differential capsule rupture (image versus non-image areas) in the invention. Under one theory all of the capsules (in both image and non-image areas) are uniformly ruptured and they transfer chromogenic material in proportion to the viscosity of the internal phase in that area or at that point of the image. Under another theory the tonal range of the images are formed by a matrix of ruptured and unruptured capsules. In actuality, a combination of both theories may occur. Regardless of the theory, upon rupture of the capsules there is patterned release and immobilization of the encapsulate according to the exposure and which it has been found corresponds to the degree of exposure such that tonal gradation is obtained.

The imaging system of the present invention can be made sensitive to various forms of radiation, and as such, the term "actinic radiation" as used herein includes the full spectra of electromagnetic radiation including ultraviolet, infrared, the entire visible spectrum, as well as X-ray and ion beam radiation. The preferred forms of actinic radiation are ultraviolet radiation and visible light having a wavelength of 190 to 800 nm and a most preferred range of 380 to 480 nm (blue light).

Ultraviolet sensitive systems are desirable because they can be handled in room light for sufficiently long periods of time to permit the photosensitive material to be removed from the light shielding packaging in which it is stored and installed in an exposure apparatus without incorporating auxiliary shielding elements into the imaging sheet. The disadvantage to ultraviolet sensitivity is that many documents are printed on papers which include optical brighteners or $TiO_2$ which absorb ultraviolet radiation and, therefore, it is difficult to use ultraviolet radiation to make copies of such documents by reflection imaging.

Blue light sensitivity is advantageous because it avoids the optical brightener problem and it is a simple matter to build temporary screening means into the system for room light handleability.

Where the imaging system is sensitive to blue or visible light, the imaging sheet may be constructed with means to temporarily shield the system from visible light to permit room-light handleability. For example, when the imaging system is sensitive to blue light having a wavelength of 380 to 480 n, imaging sheets may be constructed with a filter layer which incorporates a fugitive yellow dye. The shielding effect of the dye need not be complete, it is sufficient if the imaging sheet can be handled in room light for only the short period of time required to install it in the exposure apparatus. Once installed in the exposure apparatus, the fugitive dye is deactivated, for example, by thermal bleaching, so that the system can be exposed by blue light irradiation in the exposure apparatus. Room light handleability can also be achieved by controlling the sensitivity level of the composition such that exposure to room light of short duration does not interfere with image formation which is accomplished using more intense radiation.

The imaging system of the present invention may be embodied in a self-contained copy sheet in which the encapsulated chromogenic material and the developer material are co-deposited on one surface of a single substrate as one layer or as two contiguous layers, or in a 2-ply transfer element in which the developer material is coated on a separate substrate as a developer or copy sheet. The former system is the subject of commonly assigned U.S. application Ser No. 320,643 filed on even date herewith in the names of the same inventors. Both systems operate by photographic control of the access between the chromogenic material and the developer as previously described. In the self-contained imaging system, following capsule rupture, the chromogenic material and the developer are able to react to form a visible image in the exposed or the unexposed areas (depending on the nature of the viscosity change produced by exposure). Gradual development of the visible image is observed following exposure and capsule rupture as the chromogenic material and developer migrate, mix and react on the face of the sheet.

The transfer system addressed herein, on the other hand, operates by selective transfer of the chromogenic material from a transfer or imaging sheet to a developer or copy sheet containing the developer material. Depending on the nature of the photosensitive system encapsulated with the chromogenic material, the chromogenic material migrates from the exposed or unexposed areas of the imaging sheet to the developer sheet where it reacts with the developer and forms a visible image. For example, where a radiation curable material such as trimethylol propane triacrylate together with a photoinitiator, constitute the photosensitive composition, upon exposure the triacrylate is polymerized into a viscous mass. Thus, in the exposed areas the chromogenic material is sufficiently immobilized that it cannot transfer to the developer sheet and form color by reaction with the developer material. In the unexposed areas, which correspond to the image, the internal phase remains liquid such that the chromogenic material can be transferred to the developer sheet where it reacts with the developer and forms a positive image.

In the most typical embodiment, capsule rupture is effected by the application of pressure to the imaging sheet alone (in the case of a self-contained system) or in contact with a developer sheet (as preferred in a transfer system). Alternative means of capsule rupture can also be used. For example, systems are envisioned in which the capsules are ruptured ultrasonically, thermally, or by solvent. As previously noted, the invention is applicable to open phase systems as well as systems involving a discrete capsular wall and the method of rupture may depend on the system employed, thermal rupture being a more likely means in conjunction with an open phase system. Due to the volatility of the internal phase, in most instances the capsules are ruptured in contact with the developer sheet in transfer elements.

Various materials can be used as the chromogenic material and the developer material in the present invention. In this regard, many of the materials conventionally employed in so-called carbonless paper are also suitable for use in the present invention. In the most typical case, the chromogenic material is an electron donating compound and the developer is an electron accepting compound. Preferably, in their unreacted state, these materials are colorless or they are non-absorbing as to the exposure radiation. It is possible to interchange the chromogenic material and the developer using an electron accepting compound in conjunction with the photosensitive composition in the internal phase and using an electron donating compound as the developer material. In most cases the chromogenic material is a dye precursor and preferably a black dye precursor, although a variety of other color precursors are also disclosed below for use in the invention.

In the preferred case, the internal phase contains a radiation curable material. The radiation curable materials used in one embodiment of the invention are preferably free radical addition polymerization materials. Preferred materials are ethylenically unsaturated compounds and, more particularly, compounds having two or more ethylenically unsaturated terminal groups.

The imaging system of the present invention is quite versatile. It is useful in making copies from printed documents, duplicating blue prints and other line drawings, among other utilities. The invention system can be used to produce monochromatic copies in black or any other color. Some of its principal advantages are the superior tonal quality of the images that are obtained and the fact that imaging can be accomplished using a farily simple exposure apparatus.

BRIEF DESCRIPTION OF THE DRAWINGS

FIG. 1 is a schematic illustration in cross-section of an imaging sheet and a transfer sheet constructed in accordance with invention;

FIG. 2 is a schematic illustration of exposure of the imaging sheet; and

FIG. 3 is a schematic illustration of transfer development.

DETAILED DESCRIPTION OF THE INVENTION

FIG. 1 illustrates one embodiment of the imaging system of the present invention. Therein an imaging sheet 10 is shown comprising a substrate 12 coated with a layer of microcapsules 14. The microcapsules are filled with an internal phase 16 containing a chromogenic material and a photosensitive composition. In actuality, the microcapsules 14 are not visible to the unaided eye. Associated with the imaging sheet 10 is a developer sheet 19 comprising a substrate 20 and a layer 21 of a developer material. Again, in actuality, the developer material is not seen by the unaided eye as a separate layer.

Exposure of the imaging sheet 10 by transmission imaging is shown in FIG. 2 wherein a source of radiant energy 22 is positioned above the surface of the imaging sheet 10 with a mask 24 therebetween. In this illustration the substrate 12 is opaque and the photosensitive material is a positive working resin curable material. Irradiation of the exposed areas 28 causes the radiation curable material in the internal phase 16 to polymerize, thereby gelling, solidifying or otherwise immobilizing the chromogenic material. To simplify the illustration internal phase 16' in the exposed areas 28 is shown as a solid whereas the internal phase 16 remains liquid in the unexposed areas 26. Those skilled in the art will appreciate that while transmission imaging has been used to illustrate the invention for its simplicity, reflected light imaging is the preferred means of copying printed documents.

Image formation or development is shown in FIG. 3 wherein the now exposed imaging sheet 10 becomes a transfer sheet and is placed with its microcapsule layer 14 in face to face contact with the developer material 21 of developer sheet 19 and a pressure P is uniformly applied across the sheets. For simplification, the pressure is shown as rupturing the microcapsules in the unexposed areas 26 and not rupturing the capsules in the exposed areas 28. This is in accordance with one theory of operation which holds that in the exposed areas the internal phase is hardened to such an extent that the microcapsules can no longer be ruptured. There is another theory, however, which holds that all the capsules are ruptured but the chromogenic material is immobilized by the increased viscosity which results in the internal phase 16' in the exposed areas 28 upon exposure. In actuality all or a portion of the capsules may also be ruptured in exposed areas 28. Typically, the capsules are ruptured by passing the imaging sheet 10 and the developer sheet 20 together through a pressure nip. This causes the internal phase 16 from the unexposed areas 26 to transfer to the developer sheet 19, as shown schematically by arrows in FIG. 3. Upon transfer of the internal phase 16 to the developer sheet 19, the chromogenic material reacts with the developer layer 21 and forms an image 30 on the developer sheet. It should be apparent that while the radiation curable material provides a positive working imaging sheet in that the exposed areas are non-transferable and the unexposed areas are transferable, the transfered image 30 is reversed (right-left) compared to the latent image in the imaging sheet 10 but is a positive duplicate of the mask 24. This presents no problem if the radiation passes through an imaged transparency or mask 24 as shown in FIG. 2. But ordinary copying involves use of opaque documents which can not be used in this manner. Thus, a reflection or optical projection system is used for copying ordinary documents as is well known in other photocopying technologies.

The operational center of the imaging system of the present invention is the encapsulate or internal phase of the coating composition. In accordance with the invention, the internal phase comprises a photosensitive composition. Typically, the photosensitive composition includes a photoinitiator and a substance which undergoes a change in viscosity upon exposure to light in the presence of the photoinitiator. That substance may be a monomer, dimer, or oligomer which is polymerized to a higher molecular weight compound or it may be a polymer which is cross-linked. Alternatively it may be a compound which is depolymerized or otherwise decomposed upon exposure.

In the most typical case, the photosensitive composition includes a radiation curable material. The radiation curable materials useful in the practice of the present invention are preferably materials curable by free radical initiated chain propagated addition polymerization or ionic polymerization. Substantially any photopolymerizable composition which can be encapsulated and which does not interfere with the image-forming capability of the chromogenic material can be used. These materials may be inherently sensitive to the actinic radiation, in which case they may be hardened without a photoinitiator but usually they are materials which are curable in the presence of a photoinitiator. Furthermore, while in the most typical case, the radiation-curable materials are monomers which undergo an increase in viscosity as a result of polymerization, they may also be oligomers, prepolymers, or polymers which undergo cross-linking upon exposure. In addition to free radical polymerizable materials they may also be materials which are polymerized or cross-linked ionically, e.g., by generation of a Lewis acid.

Representative radiation curable materials are ethylenically unsaturated organic compounds. These compounds contain at least one terminal ethylenic group per molecule. Typically they are liquid and can also double as a carrier oil for the chromogenic material in the internal phase.

A preferred group of radiation curable materials is ethylenically unsaturated compounds having two or more terminal ethylenic groups per molecule. Representative examples of these compounds include ethylenically unsaturated acid esters of polyhydric alcohols such as trimethylol propane triacrylate.

Another preferred radiation curable substance is an acrylate prepolymer derived from the partial reaction of pentaerythritol with acrylic acid or acrylic acid esters. Radiation curable compositions based on such prepolymers having an acrylate functionality of between approximately two and three are available commercially in two-package system radiation curable compositions from the Richardson Company, Melrose Park, Ill., such as RL-1482 and RL-1483 which are recommended to be mixed together to form a radiation curable clear varnish in a ratio of 4.4 parts of RL-1482 to 1 part RL-1483.

Isocyanate modified acrylate, methacrylic and itaconic acid esters of polyhydric alcohols as disclosed in U.S. Pat. Nos. 3,783,151; 3,759,809 and 3,825,479 all to Carlick et al which are specifically incorporated by references, are also useful. Radiation curable compositions based on these isocyanate modified esters and including reactive diluents such as tetraethylene glycol diacrylate as well as photoinitiators such as chlorinated resins, chlorinated paraffins and amine photoinitiation synergists are commercially available as overprint varnishes from Sun Chemical Corporation, Carlstat, N.J., under the trade name of Suncure resins.

Another class of curable materials useful in the present invention are found in radiation curable inks as the photosensitive component such as a mixture of a pentaerythritol acrylate and hologenated aromatic, alicyclic or aliphatic photoinitiator as disclosed in U.S. Pat. No.

3,661,614 to Bessemir et al, which is also incorporated by reference. Still another type of radiation curable material is halogenated resins which can be cross-linked by ultraviolet radiation.

Some typical examples of radiation de-polymerizable materials useful in other embodiments of the invention are 3-oximino-2-butanone methacrylate which undergoes main chain scission upon U.V. exposure and poly 4'-alkyl acylo-phenones. See Reichmanis, E.; Am. Chem. Soc. Div. Org. Coat. Plast. Chem. Prepr. 1980, 43, 243–251 and Lukac, I.; Chmela S., Int. Conf. on Modif. Polym. 5th. Bratislave, Czech. July 3–6, 1979, I.U.P.A.C. Oxford, England 1979, 1, 176–182.

The radiation curable or depolymerizable material usually makes up the majority of the internal phase. A radiation curable material must be present in an amount sufficient to immobilize the chromogenic material upon exposure. With a depolymerizable material, on the other hand, the internal phase must be constituted such that the chromogenic material is immobilized prior to exposure but is released after exposure and capsule rupture. Typically these materials constitute 40 to 99 wt % of the internal phase (based on the weight of the oil solution containing the chromogen, the photosensitive composition and the carrier oil when present). In some embodiments, it has been found desirable to dilute the photosensitive composition with a carrier oil to improve half-tone gradation. In these cases a carrier oil is present in the amounts disclosed below and the aforesaid materials make up to 40 wt % of the internal phase.

Those skilled in the art will appreciate that various photoinitiators can be selected for use in the present invention depending on the sensitivity that is desired in accordance with the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used in the present invention. If the system relies upon ionic polymerization to tie up the chromogen, the initiator may be the anion or cation generating type depending on the nature of the polymerization. Where, for example, ultraviolet sensitivity is desired, as in the case of direct transmission imaging using ultraviolet light, suitable photoinitiators include α-alkoxy phenyl ketones, O-acylated α-oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo α-phenylacetophenones; photoreducible dye-reducing agent redox couples, halogenated paraffins (e.g., brominated or chlorinated paraffin) and benzoin alkyl ethers.

The following compounds may be useful as photoinitiators in the present invention:
α-alkoxyphenyl ketones of the formula I

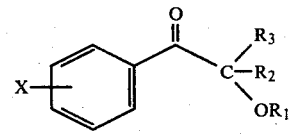

where $R^1$ is a C(1-4) alkyl group (e.g., methyl, ethyl, n-propyl, i-propyl, t-butyl, etc.), $R^2$ is a phenyl group or a substituted phenyl group wherein said substituent is as defined for X below, $R^3$ is hydrogen or a C(1-4) alkyl group, and X is hydrogen, an alkoxy group having 1 to 4 carbon atoms (e.g., methoxy, ethoxy, propyloxy, etc.), a dialkylamino group wherein said alkyl group contains 1 to 4 carbon atoms, a nitro group, a nitroso group, a cyano group, a mercapto group, chlorine, bromine or iodine, an alkyl group having 1 to 4 carbon atoms, an alkenyl group having 1 to 4 carbon atoms, an acyl group, a phenyl group, or a carboalkoxy group having 2 to 5 carbon atoms;

an α,α, dialkoxyphenyl ketone of the formula II

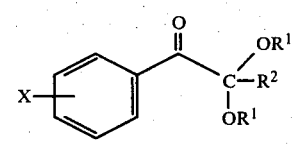

where
$R^1$, $R^2$ and X are defined as in formula I;
1-phenyl-1,2-propanedione-2-O-benzoyloxime,
9,10-phenanthraquinone,
9,10-anthraquinone,
a benzophenone of the formula III

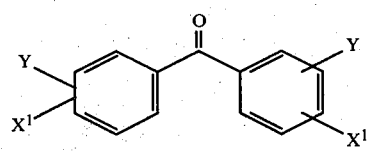

where
X' is hydrogen, an amino group, or a dialkylamino group, the alkyl group having 1 to 4 carbon atoms, and Y is hydrogen, an alkyl group having 1 to 4 carbon atoms, an alkoxy group having 1 to 4 carbon atoms, an alkenyl group having 1 to 4 carbon atoms, a phenyl group a substituted phenyl group, a dialkylamino group, a nitro group, a nitroso group, a cyano group, a mercapto group, chlorine, bromine, iodine, or an acyl group;
xanthone, a chloroxanthone, a chloromethyl xanthone, a chlorosulfonyl xanthone,
thioxanthone, a chlorothioxanthone, a chloromethyl thioxanthone, a chlorosulfonyl thioxanthone,
chloromethylnaphthalene,
chlorosulfonyl naphthalene,
chloromethyl anthracene,
chlorosulfonyl anthracene,
chloromethyl benzoxazole,
chloromethyl benzothiazole,
chloromethyl benzimidazole,
chlorosulfonyl benzoxazole,
chlorosulfonyl benzothiazole,
chlorosulfonyl benzimidazole,
a chloromethyl quinoline, a chlorosulfonyl quinoline,
a chloromethyl benzophenone,
a chlorosulfonyl benzophenone,
a chloromethyl fluorenone,
a chlorosulfonyl fluorenone,
carbon tetrabromide,
benzoin methyl ether,
benzoin ethyl ether,
desyl chloride,
desyl amine,
methylene blue/ascorbic acid,
chlorinated aliphatic hydrocarbons and combinations thereof.

The sensitivity among these compounds can be shifted by adding substituents such that the compounds generate radicals when exposed to the desired radiation wavelength. For visible (blue) light sensitivity, the aforementioned photoinitiators may be combined with a sensitizer such as Michler's ketone or an analogous dialkylamino benzophenone thereof, a substituted coumarin, a linear polyene (e.g., trans B-carotene) or sensitizing dye, e.g., a yellow dye.

For ultraviolet sensitivity a preferred photoinitiator-sensitizer is a combination of Michler's ketone and benzoin methyl ether (preferred ratio 2:5).

The photoinitiator is present in the internal phase in an amount sufficient to initiate polymerization or crosslinking within a short exposure time. Using benzoin methyl ether as an example, this photoinitiator is typically present in an amount of up to 10% based on an amount of radiation curable material in the internal phase. Naturally, the amount varies depending on the nature of the other components of the photosensitive composition. Those skilled in the art can readily determine amounts suitable for the desired exposure properties. An instantaneous system would be desirable, i.e., one which will provide an image with less than 0.5 to 1 second exposure, however, exposure times ranging from 0.5 to up to 1 minute are sometimes required. The actual exposure time will also depend on a number of variables such as coat weight, coat thickness, the radiation curable substance (rate of photopolymerization), the type and source of radiation, the radiation intensity and its distance from the sheet.

It is also possible to reduce the exposure time by incorporating a scattering agent in the capsule layer. A scattering agent increases the mean free path and thereby intensifies exposure. One such scattering agent that can be used in the present invention is magnesium oxide.

The chromogenic materials used in the present invention are preferably oil soluble color formers which will produce a color upon reaction with a developer material in the presence of a carrier oil. Substantially any of the chromogenic materials conventionally used in carbonless paper can be used in the present invention. In general, these materials are colorless electron donating type compounds. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco
methylene blue, Malachite Green Lactone,
p-nitrobenzoyl leuco methylene blue,
3-dialkylamino-7-dialkylamino-fluoran,
3-methyl-2,2'-spirobi(benzo-f-chrome),
3,3-bis(p-dimethylaminophenyl)phthalide,
3-(p-dimethylaminophenyl)-3-(1,2dimethylindole-3-yl)phthalide, 3-(p-dimethylaminophenyl)-3-(2-methylindole-3-yl)phthalide,3-(p-dimethylaminophenyl)-3-(2-phenylindole-3-yl)phthalide,
3,3-bis(1,2-dimethylindole-3-yl)-5-dimethylaminophthalide, 3,3-bis-(1,2-dimethylindole-3-yl)6-dimethylaminophthalide,
3,3-bis-(9-ethylcarbazole-3-yl)-5-dimethylaminophthalide, 3,3-bis(2-phenylindole-3-yl)-5-dimethylaminophthalide, 3-p-dimethylaminophenyl-3-(1-methyl pyrrole-2-yl)-6-dimethylaminophthalide,
4,4'-bis-dimethylaminobenzhydrin benzyl ether, N-halophenyl leuco Auramine, N-2,4,5-trichlorophenyl leuco Auramine, Rhodamine-B-anilinolactam,
Rhodamine-(p-nitroanilino)lactam,
Rhodamine-B-(p-chloroanilino)lactam,
3-dimethylamino-6-methoxyfluoran,
3-diethylamino-7-methoxyfluoran,
3-diethylamino-7-chloro-6-methylfluoroan,
3-diethylamino-6-methyl-7-anilinofluoran,
3-diethylamino-7-(acetylmethylamino)fluoran,
3-diethylamino-7-(dibenzylamino)fluoran,
3-diethylamino-7-(methylbenzylamino)fluoran,
3-diethylamino-7-(chloroethylmethylamino)fluoran,
3-diethylamino-7-(diethylamino)fluoran,
3-methyl-spiro-dinaphthopyran,
3-ethyl-spiro-dinaphthopryan,
3,3'-dichloro-spiro-dinaphthopyran,
3-benzyl-spiro-dinaphthoypyran,
3-methyl-naphtho-(3-methoxybenzo)-spiropyran,
3-propyl-spirodibenzoidipyran, etc.

Mixtures of these color precursors can be used if desired. Also useful in the present invention are the fluoran color formers disclosed in U.S. Pat. No. 3,920,510, which is incorporated by reference.

The present invention, however, is not limited to the use of the aforementioned color precursors as chromogenic materials. In addition, organic chemicals which are capable of reacting with heavy metal salts to give colored metal complexes, chelates or salts can be adapted for use in this invention.

Substantially any color forming material which can be encapsulated and which will react with a developer material to form an image can be used in the present invention. Furthermore, it is not necessary to maintain the conventional distinction between color formers and color developers in the invention system. That is, in some embodiments, the chromogenic material may be what is commonly referred to as a color developer provided it does not absorb in the exposure radiation range so as to interfere with imaging.

In addition to the chromogenic material and the photosensitive material, the internal phase of the present invention may also include a carrier oil. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, castor oil, mineral oil, deodorized kerosense, naphthenic mineral oils, dibutyl phthalate, dibutyl fumerate, brominated paraffin and mixtures thereof. Alkylated biphenyls are generally less toxic and preferred.

The presence of a carrier oil affects and can be used to control the tonal quality of the images obtained. While tonal quality (half-tone gradation) is not critical when coying printed documents, it is an important factor in faithfully reproducing pictoral images. Initial studies show that where trimethylol propane triacrylate is used in the radiation curable material, 20% of a carrier oil such as brominated paraffin improves tonal qualities.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer or monomer and oil) containing the chromogen. A preferred range is from about 2 percent to about 7 percent. The amount of the chromogenic material required to obtain suitable images depends on the nature of the chromogen, the nature of the internal phase, and the type of imaging system. Typically less chromogenic material is used in the internal phase of a self-contained imaging system in comparison to a transfer system. This is because the developer material is co-deposited on a common substrate with the chromogenic encapsulate and there is a tendency for the chromogenic material to diffuse through the capsule wall and react with the developer material during storage and because there is no inherent loss in transfer. One means of preventing undesired coloration in a self-contained sheet is to reduce the amount of the chromogenic material in the internal phase. Another means is to incorporate color suppressants with the chromogenic material.

Typically a transfer imaging sheet contains 6 percent chromogenic material in the internal phase whereas self-contained imaging sheets have been formed using 1.5 to 3 percent of chromogenic material.

As indicated above, the imaging systems of the present invention may be formulated such that they are sensitive to any of ultraviolet, infrared, X-ray, ion beam, and visible radiation. For room light handleability, ultraviolet sensitive imaging systems are preferred. Ultraviolet sensitive imaging systems are suitable for recording images from a cathode ray tube as well as in reproducing images from a transparent or translucent photomask. Both of these systems rely upon transmitted ultraviolet radiation to expose the imaging system. It has been found, however, that ultraviolet sensitivity is generally not suitable when it is desired to reproduce a printed document by reflection imaging (e.g., contact reflection imaging or optical projection imaging using reflected light). The reason for this is that the vast majority of printed documents are on papers containing optical brightening agents or $TiO_2$. These agents act as black dyes in an ultraviolet imaging system and absorb the ultraviolet radiation. Hence the background and image areas are both ultraviolet absorbers and there is no image discrimination by reflection imaging.

In making copies of printed documents, it has been found desirable to use a blue-light sensitive material. Using a blue-light sensitive material, it is possible to make the system handleable in room light by incorporating in the system a fugitive yellow filter dye which is bleached or otherwise rendered inactive or removed from the imaging system prior to exposure. The yellow dye absorbs blue-light and prevents an imaging material in accordance with invention from being exposed, for example, as it is removed from a light-shielded container and installed in an exposure apparatus. The fugitive dye may incorporated in the imaging system in a separate layer which overcoats the layer of the encapsulated chromogenic and photosensitive materials or the fugitive dye may be fixed in the wall of a discrete walled microcapsulate. Yellow fugitive dyes are well known in the art. The preferred dyes are those which can be inactivated or removed from the imaging system with the greatest ease. Using these dyes, the imaging material is heated in the exposure apparatus to a temperature at which the dye is bleached prior to exposure. Thereafter, the imaging material can be exposed by the application of light in the visible blue range. In addition to thermally bleachable fugitive dyes, the invention is also open to the use of dyes which are bleached by oxidation. Although, using these dyes, a liquid processing step would normally be required to bleach the dye.

An internal phase as described above can be encapsulated in a conventional manner. Oil soluble chromogenic materials have been encapsulated in hydrophilic wall-forming materials such as gelatin wall-forming materials (see U.S. Pat. Nos. 2,730,456 and 2,800,457 to Green et al) including gum arabic, polyvinyl alcohol, carboxymethylcellulose; resorcinol-formaldehyde wall-formers (see U.S. Pat. No. 3,755,190 to Hart et al), isocyanate wall-formers (see U.S. Pat. No. 3,914,511 to Vassiliades) isocyanate-polyol wall-formers (see U.S. Pat. No. 3,796,669 to Kiritani et al) ureaformaldehyde wall-formers and more particularly Urea-resorcinol-formaldehyde wall forms (in which oleophilicity is enhanced by the addition of resorcinal) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,025,455 to Shackle). To the extent necessary for complete disclosure of those wall-forming materials, the above mentioned patents are specifically incorporated by reference. Microencapsulation has been accomplished by a variety of known techniques including coacervation, interfacial polymerization, polymerization of one or more monomers in an oil, as well as various melting, dispersing and cooling methods.

The capsule forming material used in a given imaging system is selected based on the photosensitive composition present in the encapsulate. Thus, the formed capsule wall must be transmissive to the exposure radiation. Of the above systems urea-resorcinol-formaldehyde and gelatin capsules are preferred.

The mean size of the capsules used in the present invention generally ranges from approximately 1 to 25 microns. As a general rule, image resolution improves as the capsule size decreases with the caveat that if the capsule size is too small, depending on the nature of the substrate on which the capsules are coated, the capsules may disappear in the pores or the fiber in the substrate, but even capsules as large as 25 microns provide satisfactory resolution in the present invention. In the latter case, the incongruities in the substrate may screen the capsules from exposure and thereby diminish image quality. They may also fail to rupture upon the application of pressure. In view of the foregoing, it has been found that a preferred mean capsule size range is approximately 3 to 15 microns and particularly approximately 3 to 10 microns although, technically, the capsules can range in size up to the point that they are visible to the human eye.

Capsular coating compositions are prepared in a conventional manner in accordance with the present invention. Since the photosensitive encapsulate of the present invention is usually hydrophobic, the wall-forming constituents and the film forming binder should be hydrophilic and soluble in an aqueous based liquid as is conventional in forming capsule containing coating compositions. Otherwise in certain known reverse system the aqueous phase may be dispersed in a hydrophobic continuous phase. The microcapsules used in the present invention can be prepared by the methods disclosed in the aforementioned U.S. patents or by similar methods. For example, an oil solution of the internal phase comprising the chromogenic and photosensitive composition is dispersed in a continuous phase containing the wall-forming constituents, and microencapsulation is accomplished by, for example, coacervation or interfacial polymerization, among others. Open phase systems can be prepared by dispersing the internal phase in a solution of polymeric binder and adjusting the viscosity of the dispersion for coating. Among a wide variety of suitable binders are gelatin, polyvinyl alcohol, polyacrylamide, acrylic latices etc.

Coating compositions so formulated are applied and dried on a continuous web of paper. Any ordinary coating or printing technique can be used in making imaging sheets in accordance with the invention including such means as roller or blade coating.

The coating compositions of this invention may contain any of the various additives known in the carbonless paper art to improve the handling characteristics of the coated copy sheet such as a stilt material (e.g., starch particles), silica particles to prevent specking when a pressure nip is used for capsule rupture, etc.

In its principal embodiment, the imaging system of the present invention is used to produce copies of printed documents, and, as such, the substrate upon which the coating composition is coated is paper. The paper may be a commercial impact raw stock, or a special grade paper such as cast-coated paper and chrome rolled paper. The latter examples are desirable when using very fine microcapsules, e.g., capsules ranging in size from approximately 1 to 5 microns, as the surface of these papers is smoother and the microcapsules are not as easily embedded in the stock fibers. Transparent substrates such as polyethylene terephthalate and translucent substrates can also be used in the invention and have the advantage that the latent image formed in the imaging sheets need not be reversed for printing.

The developer material used in the present invention is a compound or material capable of reacting with the chromogenic material to produce a color image. In the most typical case, the developer material is an electron accepting compound or a so-called color developer. In the broadest sense, however, the term "developer material" as used herein refers to that half of the color-forming reactant combination which is not encapsulated with the photosensitive composition. Hence, as stated before, compounds conventionally recognized as color developers can be encapsulated as the chromogenic material in the present invention, and compounds conventionally recognized as color formers can be used outside the capsule in the invention system.

The developer materials used in the present invention are those conventionally employed in carbonless paper technology and are well known. Illustrative specific examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts of phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. Again, to the extent necessary for complete disclosure of these developer materials, the above noted patents are specifically incorporated by reference.

When used in a developer sheet, the color developer may be mixed with a binder such as latex, polyvinyl alcohol, maleic anhydride-styrene copolymer, starch and gum arabic. It is to be understood that all binders well known as film-forming materials can be used in this capacity.

Imaging sheets embodying the invention imaging system can be exposed using a fairly simple exposure apparatus. In its simplest form for reflection imaging, the apparatus requires only a radiation source, means of focusing the exposure radiation from the original onto the imaging sheet means to join the amazing sheet with the developer sheet and means for rupturing the encapsulate. Simplified means such as this can be used with the invention because development is essentially a dry process with the developer and chromogenic material reacting in only the infinitesimal droplets of solvent encapsulated in the internal phase. Furthermore, the chromogenic material and the developer are on the imaging and developer sheets in the amounts (coverage) required for imaging, hence, the invention obviates the elaborate means required in most prior photocopy systems for coating and metering the developing agent onto the imaging sheet in sufficient amounts.

The present invention is illustrated in more detail by the following non-limiting examples:

EXAMPLE 1

Ultraviolet Photosensitive Microcapsule Preparation (UF Capsules)

To 25 parts of a filtered solution prepared by dissolution of 5.0 parts of gum arabic (Celanese; grade A-13, gum arabic special) in 50.0 parts of distilled water was added with stirring 26.9 parts of a 17.1% (total solids) solution of isobutylene/maleic anhydride copolymer and sodium hydroxide, prepared by addition of 5.44 parts of isobutylene/maleic anhydride copolymer (average molecular weight=$1.0\times10^6$) and 2 parts of sodium hydroxide in 32.5 parts of distilled water with stirring and heating to 92° C. for 2 hours. Subsequently 38.3 parts of distilled water was added and after heating to 60° C. the pH of the resulting mixture was adjusted to 4.0 (from an initial pH of 8.8) by the portionwise addition of 10% (V/V) aqueous sulfuric acid. With maintenance of the 60° C. temperature and constant sitrring, 6.6 parts of urea and 0.8 parts of resorcinol were added and the pH of the mixture was readjusted to 4.0 with 10% (V/V) aqueous sulfuric as previously described. The completed solution, hereafter referred to as the aqueous phase, was maintained at 60° C. for immediate use.

Preparation of the internal phase, hereafter known as the organic phase, proceeded as follows: in a mixture of 40.0 parts of trimethylolpropane triacrylate (TMPTA) and 10.0 parts of methyl methacrylate (MMA) was dissolved with stirring and heating to 90° C., 3.0 parts of the color precursor, 3-diethylamino-6-methyl-7-anilino-fluoran. While allowing the mixture to cool to 60° C., 2.5 parts of benzoin methyl ether and 1.0 parts of 4,4'-bis(dimethylamino)benzophenone were added and the mixture was allowed to stir until complete dissolution of these materials. The completed organic phase was maintained at 60° C. for immediate use.

Preparation of the urea-formaldehyde microcapsules proceeded as follows: to a commercial Waring blender equipped with a speed control consisting of a variable voltage power supply (variable autotransformer; 0 to 140 volt range) and preheated to 60° C. by means of a heated, forced air supply was added the entire aqueous phase. With the blender operating at 40 volts, the entire organic phase, also preheated to 60° C., was carefully added in a thin continuous stream. With provisions made for maintenance of the internal temperature at 60° C., the blender was operated at 90 volts for 45 seconds to effect emulsification. Directly after this 45 second period, the power supply setting was reduced to 40 volts, an aliquot was taken and the average particle size was determined by visual examination of the emulsion under a microscope. The average particle size was 4.5 microns.

Following this determination, 18.4 parts of a 37% (W/V) aqueous formaldehyde, preheated to 60° C., were added in one portion. After blending for 2 hours the mixture was transferred to a heatable container equipped with an efficient mechanical stirrer, the temperature was maintained at 60° C. and a solution of 0.6 parts of ammonium sulfate in 12.2 parts of water was added with high speed stirring. After 1.0 hours of stirring, the mechanical stirrer was removed, provision was made for magnetic stirring and the pH was adjusted to 9.0 (from an initial pH of 3.2) by the portion-wise addition of 10% (W/V) aqueous sodium hydroxide. Microcapsule emulsion preparation was completed by the addition of 2.8 parts of sodium bisulfite followed by an additional 10 minutes of stirring.

Preparation of Light Sensitive Sheets from the Above Microcapsule Preparation

A slurry consisting of 10 parts of the above light sensitive microcapsule and 10 parts of distilled water was coated on 80 lb. black and white enamel paper stock using a #10 drawdown rod as the coating device and the coated papers were dried briefly in a circulated hot air oven at 95° C. The resulting dry sheets were immediately useable or could be stored for later use.

Preparation of Developer Sheet

To 218 parts of water were added with slow stirring 5.8 parts of a 50% aqueous suspension of styrene-butadiene latex, 40 parts of 10% aqueous 1.5% ethylated starch, 17 parts of hydrated silica gel, 21 parts of zinc carbonate, 13 parts of 47% aqueous sodium silicate, 1 part sodium hexa-meta-phosphate and 130 parts of Silton F-150 clay. After stirring at ambient temperature for 1 hour, the mixture was stabilized by the addition of 0.1 part of 37% aqueous formaldehyde and coated upon 80 lb. black and white enamel paper stock using a #10 drawdown bar as the coating device. The sheets were completed by brief drying in a recirculated hot air (95° C.) oven.

Reproduction of Images Using the Above Light Sensitive Sheets

The apparatus used in the reproduction of images using the light sensitive sheets consisted of: a near UV light source (2, 15 watt F-15-T8-BLB black light bulbs), a positive photographic transparency, a plate glass cover plate and a calender stack capable of providing at least 30 lb. per lineal inch crushing pressure. Images were reproduced in the following way: a light sensitive sheet was positioned with light sensitive surface uppermost on a horizontal surface, the positive transparency was superimposed upon this sheet, followed by the glass cover plate and the assembly was irradiated for periods of 1, 2, 3 and 4 seconds by the above mentioned UV light source positioned parallel to and approximately 5 inches from the above assembly. Following exposure, the light sensitive sheet was placed against an image receiving and developing sheet prepared as above.

The sheets were positioned such that the active layers of each were in intimate contact and the assembled sheets were calendered. Such treatment and separation of the sheets resulted in the production of a reversed positive black image. Exposures of 1 and 2 seconds gave images of essentially similar quality, with good resolution and half-tone gradation. The 2 second exposure gave somewhat less transferred and developed dye background. Exposures of 3 and 4 seconds gave lower image intensity typical of over exposure.

EXAMPLE 2

Ultraviolet Photosensitive Microcapsule Preparation (UF Capsules)

An aqueous phase was prepared in exactly the same manner and proportions as described in Example #1.

Preparation of an organic phase proceeded as follows: to 50.0 parts of tetraethylene glycol diacrylate (TEGDA) was added with heating to 90° C. and stirring 3.0 parts of the same color precursor mentioned in Example 1. After complete dissolution of the dye precursor the mixture was allowed to cool to 60° C. and 2.5 parts of benzoin methyl ether and 1.0 parts of bis-4,4'-(dimethylamino)benzophenone were added successively and the mixture was stirred at 60° C. until complete dissolution occurred. The organic phase was maintained at 60° C. for immediate use.

The preparation of the urea-formaldehyde capsules proceeded exactly as described in Example 1, with the following important modification and observation: after careful addition of the organic phase to the aqueous phase in the blender, the blender was operated at 90 volts for 60 seconds instead of 45 seconds and the observed size of the emulsion droplets was, on the average, 5.0 microns instead of 4.5 microns. Capsule preparation was completed exactly as described in Example 1.

Preparation of Light Sensitive Sheets from the Above Microcapsule Preparation A slurry consisting of 10 parts of the above microcapsule preparation and 10 parts distilled water was coated on 80 lb. black and white enamel paper stock using a #10 drawdown rod as described in Example 1. Preparation of the light sensitive sheets was completed exactly as described previously and the resulting light sensitive sheets were immediately useable or could be stored for later use.

Reproduction of Images Using the Above Light Sensitive Sheets

The apparatus used for image reproduction was exactly the same as described in Example 1. Exposures of from 1 to 4 seconds resulted in no developed image, however; exposures of 1 and 2 minutes gave high quality black image reproduction after development by calendering against the same image receiving sheet as was used and described in Example 1.

Having described the invention, it is to be understood that the invention is not limited to this precise process and product, and that changes may be made therein without departing from the scope of the invention which is defined in the appended claims.

What is claimed is:

1. A transfer imaging system in which images are formed by image-wise reaction of one or more chromogenic materials and a developer, said system comprising:
    an imaging sheet comprising a first substrate,
    a chromogenic material,
    a radiation curable composition which undergoes an increase in viscosity upon exposure to actinic radiation,
    a coating on one surface of said first substrate comprising said chromogenic material and said radiation curable composition,
    said radiation curable composition being encapsulated in rupturable capsules as an internal phase, and
    a developer sheet comprising a second substrate and a developer material capable of reacting with said chromogenic material to form an image on one surface of said second substrate,
    wherein images are formed by image-wise exposing said coating to actinic radiation, and rupturing capsules in the image areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material.

2. The imaging system of claim 1 wherein said capsule is a microcapsule having a discrete capsule wall.

3. The imaging system of claim 2 wherein said chromogenic material is encapsulated with said radiation curable composition.

4. The imaging system of claim 2 wherein said radiation curable composition comprises a photoinitiator.

5. The imaging system of claim 4 wherein said chromogenic material is a substantially colorless electron donating compound.

6. The imaging system of claim 5 wherein said developer material is an electron accepting compound.

7. The imaging system of claim 2 wherein said radiation curable composition is sensitive to ultraviolet, infrared, X-ray, ion beam, or visible radiation.

8. The imaging system of claim 2 wherein said radiation curable composition is sensitive to ultraviolet radiation.

9. The imaging system of claim 2 wherein said radiation curable composition is sensitive to blue light having a wavelength in the range from 380 to 480 nm.

10. The imaging system of claim 2 wherein said system includes means for temporarily shielding said coating composition from ambient radiation such that said system can be handled in room light for at least a short period of time without interfering with the image-forming capability of said system.

11. The imaging system of claim 10 wherein said shielding means is contained in the wall of said rupturable capsule.

12. The imaging system of claim 10 wherein said shielding means includes a yellow fugitive dye which absorbs light at a wavelength in the region of 380 to 480 nm.

13. The imaging system of claim 12 wherein said yellow fugitive dye is contained in a layer overcoating said coating composition.

14. The imaging system of claim 5 wherein said chromogenic material is an oil soluble color former.

15. The imaging system of claim 14 wherein said colorless electron donating compound is a compound having a lactone, a lactam, a sultone, a spiropyran, an ester or an amido structure.

16. The imaging system of claim 2 wherein said capsule wall is formed by a hydrophilic material which transmits said actinic radiation.

17. The imaging system of claim 16 wherein said capsule wall is formed by a material selected from the group consisting of gelatin, polyamide, polyvinyl alcohol, resorcinol-formaldehyde resin, polyisocyanate resin, urea-formaldehyde resin, urea-resorcinol-formaldehyde resin, melamine-formaldehyde resin, and hydroxypropyl cellulose, and combinations thereof.

18. The imaging system of claim 6 wherein said electron accepting compound is selected from the group consisting of clay minerals, organic acids, acid polymers, metal salts of aromatic carboxylic acids, oil soluble metal salts of phenol-formaldehyde novalak resins, zinc carbonate and combinations thereof.

19. The imaging system of claim 1 wherein said radiation curable material is a material polymerizable by free radical addition polymerization or ionic polymerization.

20. The imaging system of claim 19 wherein said radiation curable material is an ethylenically unsaturated compound.

21. The imaging system of claim 20 wherein said radiation curable material contains two or more ethylenically unsaturated terminal groups.

22. A transfer imaging process comprising:
    image-wise exposing to actinic radiation an imaging sheet comprising a first substrate and a coating composition on one surface of said substrate, said coating composition including a chromogenic material and a radiation curable composition which undergoes an increase in viscosity upon exposure to actinic radiation, said radiation curable composition being encapsulated in rupturable capsules, rupturing capsules in the image areas, and transferring said chromogenic materials from the ruptured capsules to a sheet carrying a developer material on one surface such that there is a patterned reaction between said developer material and said chromogenic material which produces an image.

23. The process of claim 22 wherein said rupturable capsule is a microcapsule defined by a discrete capsule wall.

24. The process of claim 23 wherein said image-wise exposing is by transmission imaging.

25. The process of claim 23 wherein said image-wise exposing is by reflection imaging.

26. The process of claim 23 wherein said capsules are ruptured by applying pressure to said imaging sheet and said developer sheet, said sheets being superposed with said developer material facing on said coating composition.

27. The process of claim 26 wherein said actinic radiation is ultraviolet radiation, infrared radiation, visible light, x-ray, or ion beam irradiation.

28. The process of claim 27 wherein said actinic radiation is ultraviolet radiation or visible blue light having a wavelength in the range 380 to 480 nm.

29. The imaging system of claim 3 wherein said chromogenic material is an electron accepting compound and said developer material is a substantially colorless electron donating compound.

30. The process of claim 23 wherein said chromogenic material is a substantially colorless electron donating compound and said developer material is an electron accepting compound.

31. The process of claim 23 wherein said chromogenic material is an electron accepting compound and said developer material is a substantially colorless electron donating compound.

* * * * *